United States Patent
Bueb et al.

(10) Patent No.: US 11,604,710 B2
(45) Date of Patent: *Mar. 14, 2023

(54) DETAILED FAILURE NOTIFICATIONS IN MEMORY SUB-SYSTEMS

(71) Applicant: Micron Technology, Inc., Boise, ID (US)

(72) Inventors: Christopher J. Bueb, Folsom, CA (US); Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 58 days.

This patent is subject to a terminal disclaimer.

(21) Appl. No.: 17/301,098

(22) Filed: Mar. 24, 2021

(65) Prior Publication Data

US 2021/0208984 A1 Jul. 8, 2021

Related U.S. Application Data

(63) Continuation of application No. 16/601,028, filed on Oct. 14, 2019, now Pat. No. 10,977,139.

(51) Int. Cl.
| | |
|---|---|
| *G06F 11/00* | (2006.01) |
| *G06F 11/16* | (2006.01) |
| *G06F 11/07* | (2006.01) |
| *G06F 11/30* | (2006.01) |
| *G11C 11/408* | (2006.01) |
| *G11C 29/52* | (2006.01) |

(Continued)

(52) U.S. Cl.
CPC ...... *G06F 11/1666* (2013.01); *G06F 11/0772* (2013.01); *G06F 11/3037* (2013.01); *G06F 12/0246* (2013.01); *G11C 11/409* (2013.01); *G11C 11/4085* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 8,935,465 B1 * | 1/2015 | Shaharabany | G06F 3/0679 711/103 |
| 9,760,481 B2 * | 9/2017 | D'Abreu | G11C 7/1075 |
| 10,854,311 B1 * | 12/2020 | Hieb | G06F 3/0646 |

(Continued)

OTHER PUBLICATIONS

Y. Cai, S. Ghose, E.F. Haratsch, Y. Luo and Mutlu, "Error Characterization Mitigation, and Recovery in Flash-Memory-Based Solid-State Drives", in Proceedings of the IEEE, vol. 105, No. 9, pp. 1666-1704, Spet. 2017, doi: 10.1109/JPROC.2017.2713127 (Year: 2017).

*Primary Examiner* — Daniel F. McMahon
(74) *Attorney, Agent, or Firm* — Lowenstein Sandler LLP

(57) ABSTRACT

Disclosed is a system, and a method of using the system, that includes a memory component and a processing device. The processing device provides, to a host system, a failure notification that includes an indication of memory cell(s) of the memory device storing a data that was corrupted during a memory operation. The processing device then receives a replacement data from the host system. The replacement data is provided in response to the host system identifying a range of logical addresses corresponding to the corrupted data, based on geometric parameters of the memory device and the failure notification.

20 Claims, 8 Drawing Sheets

(51) Int. Cl.
*G11C 11/409* (2006.01)
*G06F 12/02* (2006.01)

(56) References Cited

U.S. PATENT DOCUMENTS

| | | | |
|---|---|---|---|
| 2005/0172065 A1* | 8/2005 | Keays | G06F 11/1068 |
| | | | 711/E12.008 |
| 2015/0248322 A1* | 9/2015 | Hara | G06F 11/0775 |
| | | | 714/53 |
| 2016/0162353 A1* | 6/2016 | Manohar | H03M 13/27 |
| | | | 714/760 |
| 2017/0024277 A1* | 1/2017 | Wong | G06F 3/0652 |
| 2017/0115891 A1* | 4/2017 | O'Krafka | G06F 3/0629 |
| 2018/0107391 A1* | 4/2018 | Hashimoto | G06F 12/0246 |
| 2019/0012099 A1* | 1/2019 | Mulani | G06F 3/0619 |

\* cited by examiner

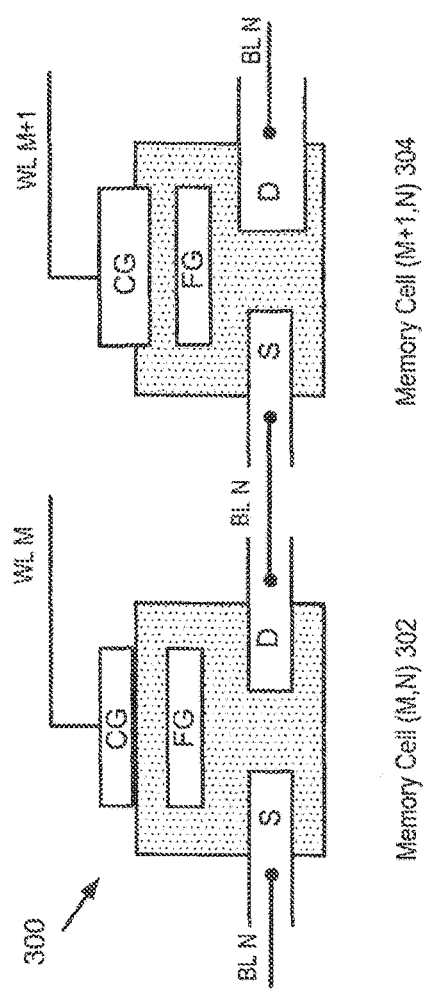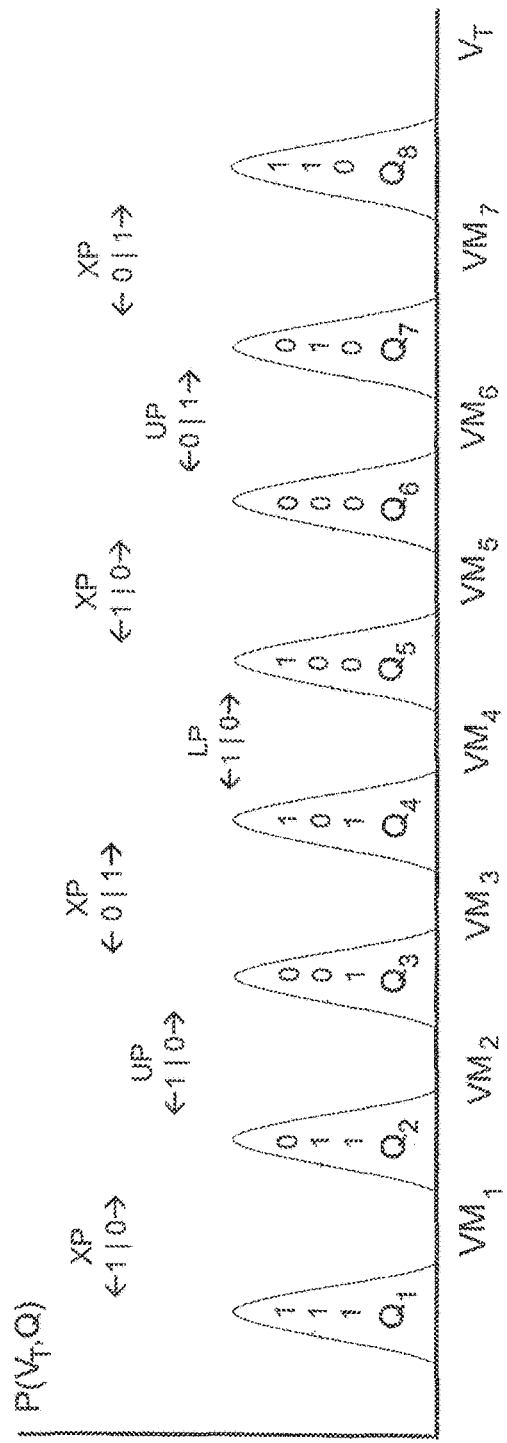
FIG. 3A
FIG. 3B
FIG. 3C

DETAILED FAILURE NOTIFICATIONS IN MEMORY SUB-SYSTEMS

RELATED APPLICATION

This application is a continuation of U.S. patent application Ser. No. 16/601,028, filed Oct. 14, 2019, which is herein incorporated by reference in its entirety.

TECHNICAL FIELD

Implementations of the disclosure relate generally to memory systems, and more specifically, relate to providing, to a host system, geometric parameters of a memory sub-system and detailed failure notifications to signal that an attempt to program data to the memory sub-system has failed to aid the host system in generating replacement data and remedying the data programming failure.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various implementations of the disclosure.

FIG. 3A illustrates schematically floating gate transistor-based memory cells as arranged in a memory device, in accordance with some implementations of the present disclosure.

FIG. 3B illustrates schematically dependence of the source-drain current on the control gate voltage for two non-identical memory cells having different threshold control gate voltages, in accordance with some implementations of the present disclosure.

FIG. 3C illustrates schematically a distribution of threshold control gate voltages for a flash memory cell capable of storing three bits of data by programming the memory cell into at least eight charge states that differ by the amount of charge on the cell's floating gate in accordance with some implementations of the present disclosure.

DETAILED DESCRIPTION

Figure 1:
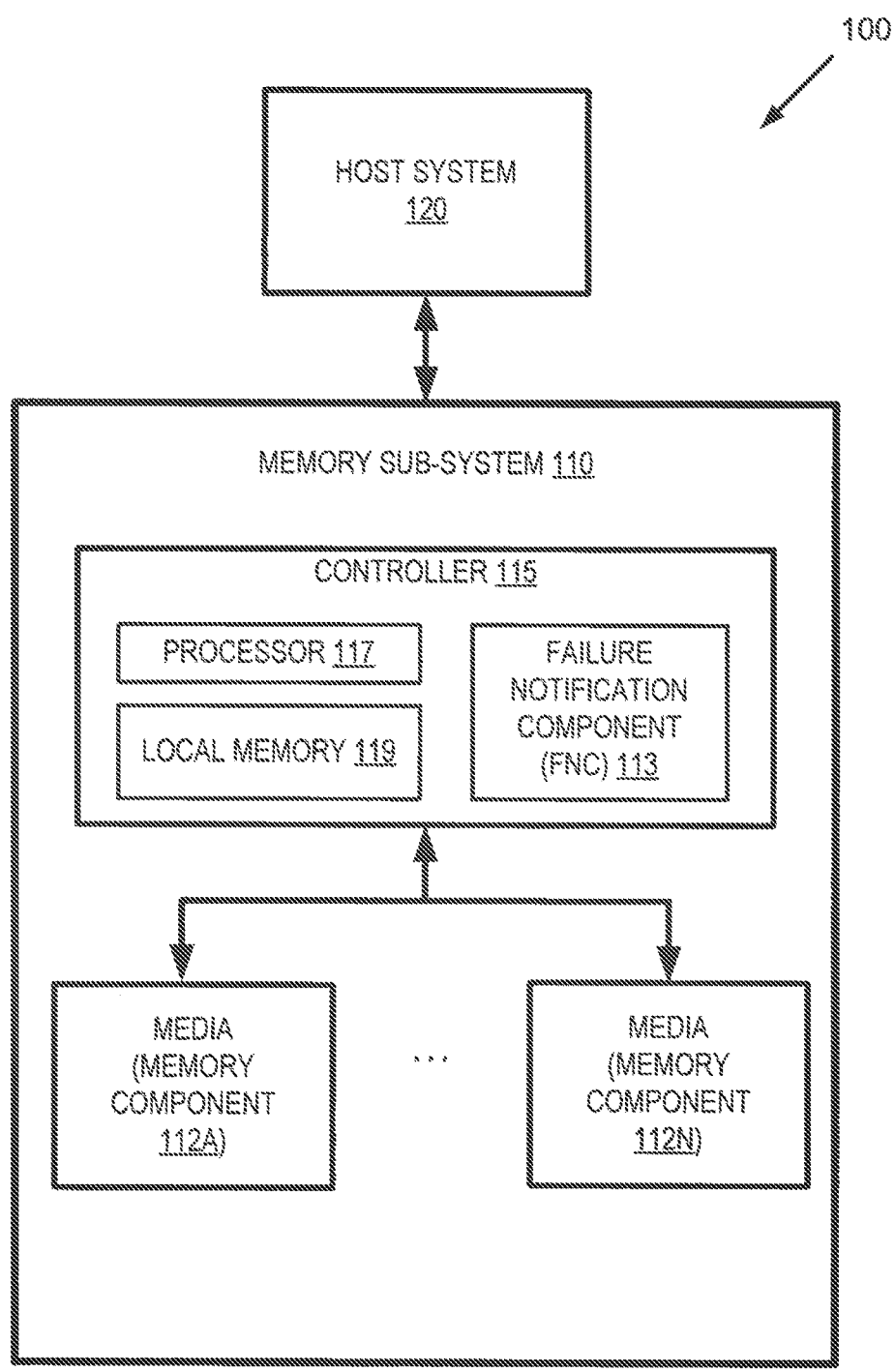
FIG. 1 illustrates an exemplary computing environment capable of communicating, from a memory sub-system to a host system, geometric parameters and detailed failure notifications about an unsuccessful write operation attempted by the memory sub-system in accordance with some implementations of the present disclosure.

Aspects of the present disclosure are directed to correcting errors that can occur during migration of data between different memory components of a memory sub-system storing data generated and used by a host system. Such error correction can be facilitated by providing, to the host system, failure notifications that can be used for identifying a range of memory cells that failed to store correct representations of migrated data and/or for identifying a previously stored data that has been corrupted during data migration. The loss of data can be remedied by providing, to the host system, geometric parameters of a target memory component. The geometric parameters can be used by the host system to determine a range of logical addresses of the memory sub-system that correspond to the range of failed memory cells. Using the determined logical addresses, the host system can be able to determine what data has been lost or corrupted during data migration and take a remedial action to restore the affected data or to restore a state of the host system that existed prior to the loss of data.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system. The memory sub-system can be integrated within the host system, such as a smartphone, camera, media player, or other computing device.

In various implementations, one or more memory components of the memory sub-system can be faster volatile media, such as a random access memory (e.g., DRAM or SRAM). Some of the other memory components of the memory sub-system can be slower non-volatile media, such as a flash memory, e.g., a solid state drive, a Universal Serial Bus (USB) flash drive, a NAND-based storage device, a cross-point array of non-volatile memory cells, or other types of non-volatile memory. The memory sub-system can first store data received from the host system in one of the faster memory components, e.g., in cache, in some implementations. At some later instance of time (e.g., during downtime or at regular time intervals), the memory sub-system can migrate the data stored in a first memory component to a second memory component. The second memory component can be some other type of memory device. During or after migration, the memory sub-system can erase the data from the first memory component to make it available to store additional data from the host system. Later, the memory sub-system can similarly migrate this additional data to the second memory component. Storage of data on certain media types relies on precise placement of electric charges into memory cells of the memory device. Because electric charges in nearby memory cells interact via significant Coulomb forces, programming (storing) of data can fail.

Data that is incorrectly programmed can cause host system failure when such incorrect data is later read out and provided to the host. To prevent host system failures, a microcontroller (e.g., a processor) of the memory sub-system can detect instances of data programming failures and provide failure notifications to the host system. Alternatively, upon receiving a data programming failure notification, the host system, or an application running on the host system, can resort to a hardware or software reset (reboot, restart, etc.) operation. Such a reset operation can take a certain time, ranging from tenths of a second to several seconds, in some implementations. In time-critical applications, such as embedded automotive applications, surveillance applications, safety applications, and other applications where time is essential, such delays can be unacceptable.

Aspects of the present disclosure address the above challenges by providing detailed failure notifications, communicated by the memory controller to the host server, describing the scope of the memory media failure. For example, the failure notification can characterize the occurred failure as a failure of data-in-flight only, such as when only the data intended to be written during the last write operation has failed to program properly. Alternatively, the failure notification can characterize the failure as a data-at-rest failure, such as when a previously stored data has been corrupted. The failure notification can indicate the extent of the programming failure, such as "current wordline only" failure, a "multiple wordlines" failure, a "block" failure, a "multiple block" failure, a "plane" failure, and so on. Aspects of the present disclosure also address providing geometric parameters to the host system to help the host system with interpreting failure notifications and determining what specific LBAs are associated with the data that has been corrupted during the write operation. For example, the geometric parameters can include a programming sequence of various partitions (dies, planes, blocks, wordlines) of the memory component. By comparing the information included in the failure notification with the geometric parameters of the memory component, the host system can determine the range of logical addresses associated with (in the following often simply referred as "storing") missing or corrupt data. The host system can subsequently take a number of possible remedial actions, such as repeating the last write operation, if the lost data is still available somewhere (in the cache of the memory sub-system or in a separate cache of the host system). If the data is no longer available, the host system can repeat selected computational operations in order to restore the lost data. For example, the host system can return to the most recent saved context of the application that the host system is running and resume execution of the application starting from that saved context.

Such remedial action, in contrast to hardware or software resets or reboots, can significantly reduce downtime of programs running on the host system, thus providing a crucial advantage for time-sensitive applications.

FIG. 1 illustrates an exemplary computing environment 100 capable of communicating, from a memory sub-system 210 to a host system 220, geometric parameters and detailed failure notifications about an unsuccessful write operation attempted by the memory sub-system 210. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some implementations, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some implementations, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as a group of memory cells, word lines, word line groups (e.g., multiple word lines in a group), or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (e.g., processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some implementations, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another implementation of the disclosure, a memory sub-system 110 cannot include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some implementations, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 can include a failure notification component (FNC) 113 that performs operations as described herein. In some implementations, the FNC 113 can be part of the host system 120, a controller 115, memory components 112A-112N, an operating system, or an application. The FNC 113 can mitigate memory operations failures that inevitably occur from time to time in the memory sub-system 110.

For example, a first memory cell of a wordline of the memory component 112A can be properly programmed (using electronic circuitry not explicitly shown in FIG. 1) by receiving an appropriate control gate voltage signal to the cell (as explained in more detail below). However, the charge state of the first memory cell can be disturbed when a second memory cell of the same wordline is programmed, at a later time. As a result, at least some of the memory cells (and, possibly, a significant fraction) of the wordline's memory cells can end up storing incorrect bits of information. In other instances, the wordline can be programmed correctly, but the charge states of the memory cells of the wordline can be subsequently altered (corrupted) when a neighboring (e.g., adjacent) wordline is programmed. In some instances, more than one wordline can be affected, so that data previously stored in more than one wordline can become corrupted. Additionally, programming operations can fail as a result of hardware circuitry errors resulting in a loss or corruption of data in one or more partitions of the memory component 112A.

A microcontroller (e.g., a processor) 117 of the memory sub-system can detect a data programming failure and provide a failure notification to the host system 120. Upon receiving a data programming failure notification from the memory sub-system 110, the host system 120 can attempt to estimate how much data has been lost/corrupted and remedy the situation by providing replacement data to overwrite the data that has been lost or corrupted. One deficiency of such an approach is that making an accurate and reliable estimate cannot always be possible since the physical partitions of the memory sub-system 110 can be programmed in a non-consecutive fashion. For example, the host system 120 can write two memory pages (e.g., two 16 KB or two 32 KB memory pages) into storage locations (e.g., of the memory component 112A) associated with consecutive logical addresses, e.g., logical block addresses (LBA), such as logical addresses XYZ01 and XYZ02. However, storage locations identified to the host system 120 by consecutive LBAs can be stored in physical partitions located in different regions of the memory component 112 A (or another memory device). Conversely, adjacent physical partitions can store data identified to the host system 120 by non-consecutive LBAs, e.g., XYZ01 and XYZ09, with multiple (seven, in this example) intervening LBAs associated with data that can be stored elsewhere in the memory component. Accordingly, a notification that the data intended by the host to be stored in association with a specific LBA (e.g, XYZ01) failed to program correctly can be insufficient to make a reliable estimate regarding what other data have been affected by this data programming failure. More specifically, the data associated with the logical address XYZ02 can be intact whereas data associated with XYZ09 may have been corrupted. As a result, at least some of data programming failures cannot be remedied completely, and thus at least some host system failures cannot be avoided if the host system has to rely on guesswork.

To facilitate locating memory partitions that have suffered from a memory failure, the FNC 113 can provide to the host system 120 geometric parameters describing physical topology of one or more memory components 112A-112N. The geometric parameters provided by the FNC 113 to the host system 120 can also describe how logical addresses used by the host system 120 for memory accesses are mapped on the physical addresses of one or more memory components 112A-112N. The geometric parameters provided by the FNC 113 to the host system 120 can further include a sequence of programming operations used to store data into one or more memory components 112A-112N. The FNC 113 can also monitor actual programming (write) operations performed by the controller 115 to store data on one or more memory components 112A-112N. The FNC 113 can detect when a write operation has failed to store data on one or more memory components 112A-112N, or detected that a previously stored data has been corrupted by a write operation. The FNC 113 can determine the scope and extent of the write operation failure, generate a failure notification and provide the failure notification to the host system 120. In some implementations, the FNC 113 can then receive additional data (a replacement copy or a new data) from the host system 120 to remedy the consequences of the failed write operation. In other implementations, the controller 115 can receive additional data without any further involvement of the FNC 113. In some implementations, the controller 115 and/or the FNC 113 can then execute a second write operation to store the additional data on one or more memory components 112A-112N. The particular component 112 can be the same as or different component than the target component of the initial write operation. The aforementioned (and any additional) operations can be executed by the processor 117 (processing device) configured to execute instructions stored in local memory 119 for performing the operations described herein.

Figure 2:
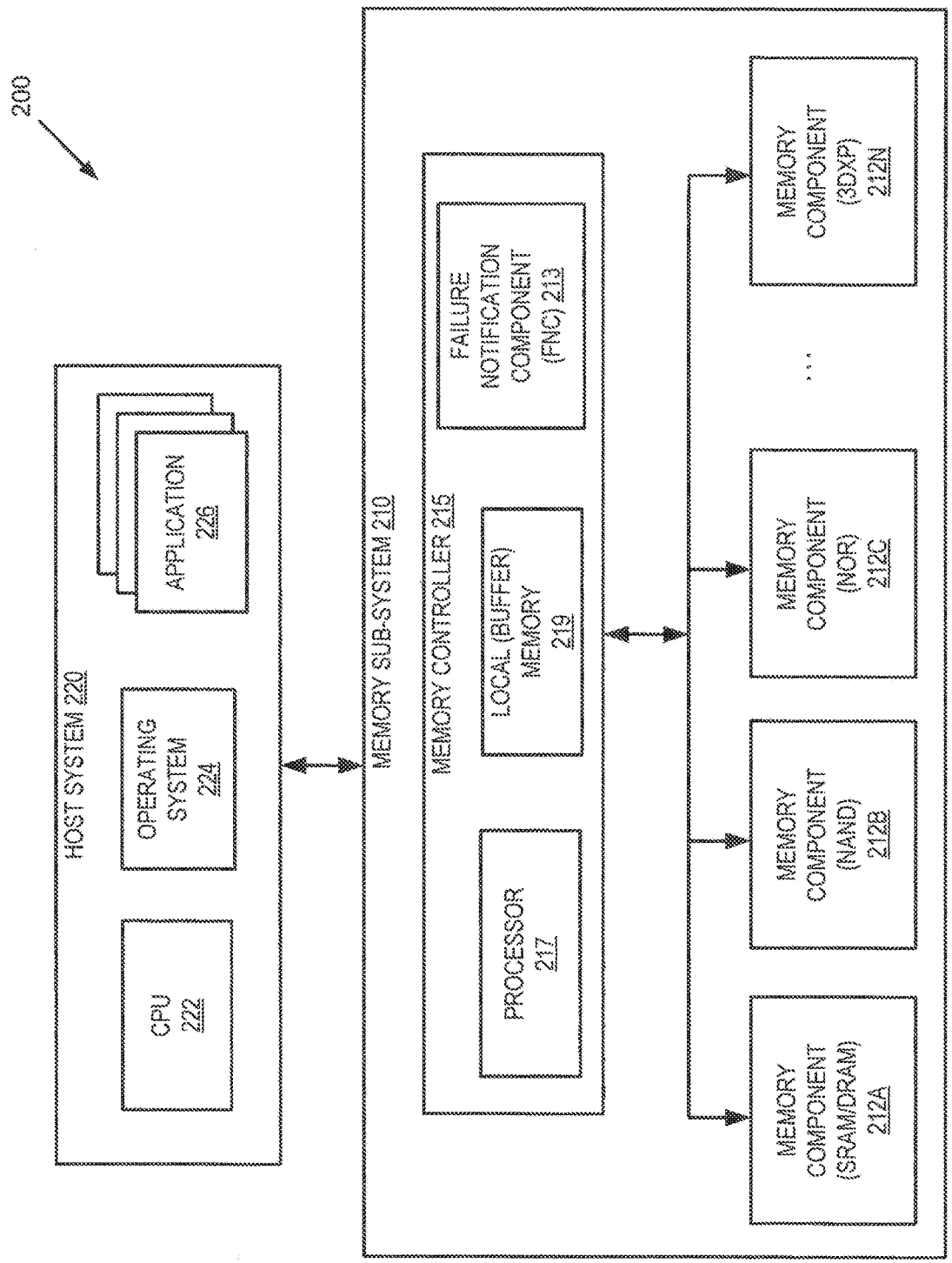
FIG. 2 illustrates another exemplary computing environment capable of communicating, from a memory sub-system to a host system, geometric parameters and detailed failure notifications about an unsuccessful write operation attempted by the memory sub-system. and receiving, from the host system, additional data to remedy the outcome of the unsuccessful write operation, in accordance with some implementations of the present disclosure.

FIG. 2 illustrates another exemplary computing environment capable of communicating, from a memory sub-system 210 to a host system 220, geometric parameters and detailed failure notifications about an unsuccessful write operation attempted by the memory sub-system 210. Various components of FIG. 2, whose numberings differ from those of the corresponding components of FIG. 1 by the first digit, can indicate the same or equivalent components, in some implementations. For example, the memory controller 115 can be the same or equivalent to the memory controller 215.

The memory controller 215 of a memory sub-system 210 can include a processor 217, a local memory 219, and a FNC 213. The memory controller 215 can be coupled to a number of memory components 212A-212N, such a SRAM or DRAM component 212A, a NAND component 212B, a NOR component 212C, and a cross-point array component 212N, in one illustrative implementation. Even though only one of different types of memory is shown in FIG. 2, the memory sub-system 210 can include any number of components of the corresponding type. In some implementations, one or more of the shown components can be absent.

The host system 220 can include a central processing unit (CPU) 222. The CPU 222 can execute instruction to instantiate an operating system 224. The operating system 224 can support one or more applications 226. Instructions to instantiate the operating system and applications 226 can be stored in one or more memory components 212A-212N. Alternatively, such instructions can be stored in a separate memory (not shown) of the host system 220. In some implementations, one or more applications 226 can be embedded applications. Instructions to execute one or more embedded applications can be stored in a read-only memory (ROM), which can be a part of the memory sub-system 210 or the host system 220, in various implementations.

Among memory components 212A-212N can be one or more memory devices (e.g., NAND, NOR, a cross-point array) that utilize transistor arrays built on semiconductor chips. As illustrated schematically in FIG. 3A, a memory cell of a memory device can be a transistor, such as metal-oxide-semiconductor field effect transistor (MOSFET), having a source (S) electrode and a drain (D) electrode to pass electric current there through. The source and drain electrodes can be connected to a bitline (BL). Multiple memory cells can share a bitline, as in NAND memory devices, in one implementation. For example, two memory cells 302 and 304 illustrated in FIG. 3A can be connected to the same bitline N and two different wordlines, M and M+1, respectively. Alternatively, e.g., in NOR memory devices, each memory cell can have a dedicated bitline that is not shared with other memory cells. A memory cell can further have a control gate (CG) electrode to receive a voltage signal $V_{CG}$ to control the magnitude of electric current flowing between the source electrode and the drain electrode. More specifically, there can be a threshold control gate voltage $V_T$ (herein also referred to as "threshold voltage" or simply as "threshold") such that for $V_{CG}<V_T$, the source-drain electric current can be low, but can increase substantially once the control gate voltage has exceeded the threshold voltage, $V_{CG}>V_T$. Because the actual geometry of gates and electrodes of a memory cell (as well as the environment of the memory cell) can vary from cell to cell, the threshold voltages $V_T$ can be different even for transistors implemented on the same die. For example, as illustrated in FIG. 3A, memory cell 304 can include gates and electrodes having different sizes. As a result, transistors of the same memory device can be characterized by a distribution of their threshold voltages, $P(V_T)=dW/dV_T$, so that $dW=P(V_T)dV_T$ represents the probability that any given transistor has its threshold voltage within the interval $[V_T, V_T+dV_T]$. For example, FIG. 3B illustrates schematically dependence of the source-drain current $I_{SD}$ on the control gate voltage for two non-identical memory cells, e.g. memory cell 302 (solid line) and memory cell 304 (dashed line), having different threshold control gate voltages, in one exemplary implementation.

To make a memory cell non-volatile, the cell can be further equipped with a conducting island—a floating gate (FG)—that can be electrically isolated from the control gate, the source electrode, and the drain electrode by insulating layers (depicted in FIG. 3A as the dotted region). In response to an appropriately chosen positive (in relation to the source potential) control gate voltage $V_{CG}$, the floating gate can receive (via Fowler-Nordheim tunneling or hot electron injection) a negative electric charge Q, which can be permanently stored thereon even after the power to the memory cell—and, consequently, the source-drain current—is ceased. The charge Q can affect the distribution of threshold voltages $P(V_T, Q)$. Generally, the presence of the negative charge Q shifts the distribution of threshold voltages towards higher voltages, compared with the distribution $P(V_T)$ for an uncharged floating gate. This happens because a stronger positive control gate voltage $V_{CG}$ can be needed to overcome a negative potential of the floating gate charge Q. If any charge of a sequence $Q_k$ of charges with $1 \leq k \leq 2^N$ can be selectively programmed (and later detected during a read operation) into a memory cell, the memory cell can function as an N-bit storage unit. The charges $Q_k$ are preferably selected to be sufficiently different from each other, so that any two adjacent voltage distributions $P(V_T, Q_k)$ and $P(V_T, Q_{k+1})$ do not overlap being separated by a valley margin, so that $2^N$ distributions $P(V_T, Q_k)$ are interspaced with $2^N - 1$ valley margins.

FIG. 3C illustrates schematically a distribution of threshold control gate voltages for a memory cell capable of storing three bits of data by programming the memory cell into at least eight charge states that differ by the amount of charge on the cell's floating gate. FIG. 3C shows distributions of threshold voltages $P(V_T, Q_k)$ for $2^N = 8$ different charge states of a tri-level cell (TLC) separated with $2^3 - 1 = 7$ valley margins $VM_k$. Accordingly, a memory cell programmed into a charge state k-th (i.e., having the charge $Q_k$ deposited on its floating gate) can be storing a particular combination of N bits (e.g., 0110, for N=4). This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not.

In general, storage devices with NAND memory are classified by the number of bits stored by each cell of the memory. For example, a single-level cell (SLC) memory has cells that can each store one bit of data (N=1). A multi-level cell (MLC) memory has cells that can each store up to two bits of data (N=2), a tri-level cell (TLC) memory has cells that can each store up to three bits of data (N=3), and a quad-level cell (QLC) memory has cells that can each store up to four bits of data (N=4). In some storage devices, each wordline of the memory can have the same type of cells within a given partition of the memory device. That is, all wordlines of a block or a plane are SLC memory, or all wordlines are MLC memory, or all wordlines are TLC memory, or all wordlines are QLC memory. Because an entire wordline is biased with the same control gate voltage $V_{CG}$ during write or read operations, a wordline in SLC memory typically hosts one memory page (e.g., a 16 KB or a 32 KB page) that is programmed in one setting (by selecting various bitlines consecutively). A wordline of a higher-level (MLC, TLC, or QLC) memory cell can host multiple pages on the same wordline. Different pages can be programmed (by the memory controller 215 via electronic circuitry) in multiple settings. For example after a first bit is programmed on each memory cell of a wordline, adjacent wordlines can first be programmed before a second bit is programmed on the original wordline. This can reduce electrostatic interference between neighboring cells. As explained above, the memory controller 215 can program a state of the memory cell and then read can read this state by comparing a read threshold voltage $V_T$ of the memory cell against one or more read level thresholds. The operations described herein can be applied to any N-bit memory cells.

For example, a TLC can be capable of being in one of at least eight charging states $Q_k$ (where the first state can be an uncharged state $Q_1 = 0$) whose threshold voltage distributions are separated by valley margins $VM_k$ that can be used to read out the data stored in the memory cells. For example, if it is determined during a read operation that a read threshold voltage falls within a particular valley margin of 2N−1 valley margins, it can then be determined that the memory cell is in a particular charge state out of 2N possible charge states. By identifying the right valley margin of the cell, it can be determined what values all of its N bits have. The identifiers of valley margins (such as their coordinates, e.g., location of centers and widths) can be stored in a read level threshold register of the memory controller 215.

The read operation can be performed after a memory cell is placed in one of its charged states $Q_k$ by a previous write operation. For example, to program (write) 96 KB (48 KB) of data onto cells belonging to a given wordline M of a TLC, a first programming pass can be performed. The first programming pass can store 32 KB (16 KB) of data on the wordline M by placing appropriate charges on the floating gates of memory cells of the workline M. For example, a charge Q can be placed on the floating gate of a specific cell. A cell is programmed to store value in its lower-page (LP) bit if the cell is driven to any of the charge states $Q_1, Q_2, Q_3$, or $Q_4$. The cell is programmed to store value 0 in its LP bit if the cell is driven to any of the charge states $Q_5, Q_6, Q_7$, or $Q_8$. As a result, during a read operation it can be determined that the applied control gate voltage $V_{CG}$ placed within the fourth valley margin $VM_4$ is sufficient to open the cell to the source-drain electric current. Hence, it can be concluded that the cell's LP bit is in state 1 (being in one of the charge states $Q_k$ with k≤4). Conversely, during the read operation it can be determined that the applied control gate voltage $V_{CG}$ within the fourth valley margin is insufficient to open the cell to the source-drain electric current. Hence, it can be concluded that the cell's LP bit is in state 0 (being in one of the charge states $Q_k$ with k>4).

After cells belonging to the M-th wordline have been programmed as described, the LP has been stored on the M-th wordline and the programming operation can proceed with additional programming passes to store an upper page (UP) and an extra page (XP) on the same wordline. Although such passes can be performed immediately after the first pass is complete (or even all pages can be programmed in one setting), in order to minimize errors it can be advantageous to first program LPs of adjacent wordlines (e.g., wordlines M+1, M+2, etc.) prior to programming UP and XP into wordline M. Indeed, due to electrostatic interaction between electric charges, charges that are placed on a given wordline can modify threshold voltages of memory cells belonging to adjacent wordlines (as well as thresholds of memory cells within the same wordline). Therefore, it can be disadvantageous to have significantly different charges on neighboring memory cells. Accordingly, it can be beneficial—from the perspective of minimizing occurrences of erroneously programmed bits—to program adjacent wordlines incrementally. For example, programming of a LP on wordline M can be followed with programming of a LP into wordline M+1, followed with programming an LP into wordline M+2, followed with programing an UP into wordline M, and so on, with virtually unlimited number of possible sequences of programming various pages on various wordlines.

When the UP is to be programmed into wordline M, a charge state of a memory cell can be adjusted so that its distribution of threshold voltages is further confined within a known valley margins VM. For example, a cell that is in one of the charge states $Q_1$, $Q_2$, $Q_3$, or $Q_4$ (accorded bit 1 status for LP programming) can be driven to just one of two states $Q_1$ or $Q_2$, in which case the cell is to store value 1 in its UP bit. Conversely, a cell can be driven to one of two states $Q_3$ or $Q_4$ to store value 0 in its UP bit. As a result, during a read operation it can be determined that the applied control gate voltage $V_{CG}$ within the second valley margin $VM_2$ is sufficient to open the cell to the source-drain electric current. Hence, it can be concluded that the cell's UP bit is in state 1 (being in one of the charge states $Q_k$ with k≤2). Conversely, during a read operation it can be determined that the applied control gate voltage $V_{CG}$ within the second valley margin $VM_2$ is insufficient to open the cell to the source-drain electric current. Hence, it can be concluded that the cell's UP bit is in state 0 (being in one of the charge states $Q_k$ with 2<k≤4). Likewise, charge states $Q_5$, $Q_6$, $Q_7$, or $Q_8$ (accorded bit 0 status for LP programming) can be further driven to the states $Q_5$ or $Q_6$ (UP bit value 0) or the states $Q_7$ or $Q_8$ (UP bit value 1).

Similarly, the extra page (XP) can be programmed into the wordline M by further adjusting the charge state of each its memory cell. For example, a cell that is in the logic state 10 (i.e., UP bit stores value 1 and LP bit stores value 0) and is in one of the charge states $Q_7$ or $Q_8$ can be driven to state $Q_7$ to store value 0 in its XP bit (logic state 010). Alternatively, the cell can be driven to charge state $Q_8$ to store value 1 in its XP bit (logic state 110). As a result, during a read operation it can be determined that the applied control gate voltage $V_{CG}$ within the seventh valley margin is insufficient to open the cell to the source-drain electric current. Hence, it the memory controller 215 can determine that the cell's logic state is 110 (corresponding to charge state $Q_7$). Conversely, during a read operation it can be determined that the applied control gate voltage $V_{CG}$ within the seventh valley margin $VM_7$ is sufficient to open the cell to the source-drain electric current. Hence, the memory controller 215 can determine that the cell's XP bit stores value 0. If it is further determined that control gate voltages $V_{CG}$ within the first six valley margins are insufficient to open the cell to the electric current, the memory controller 215 can ascertain the logic state of the cell as 010 (corresponding to the charge state $Q_7$).

Figure 4:
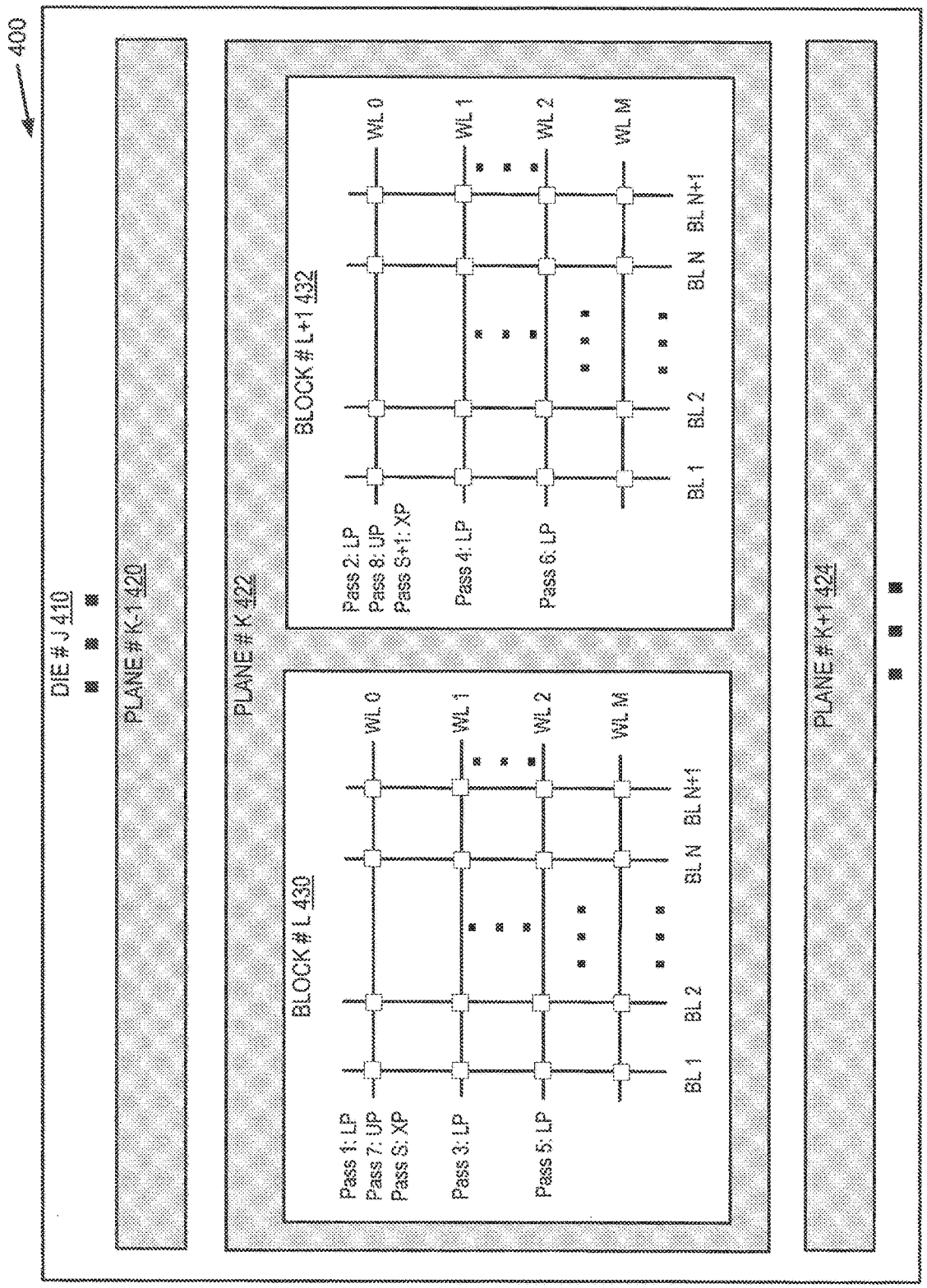
FIG. 4 provides one exemplary depiction of a physical partitioning of a memory component that illustrates a type of geometric information that can be provided by the memory controller to the host system, in accordance with some implementations of the present disclosure.

FIG. 4 provides one exemplary depiction 400 of a physical partitioning of a memory component 212 that illustrates a type of geometric information that can be provided by the memory controller 215 to the host system 220, in one implementation. A memory subsystem 210 can have one or more memory components 212, such as NAND, NOR, cross-point array, and the like. The memory component 212 can include one or more dies. One exemplary die J (410) out of a possible plurality of dies is depicted on FIG. 4. One or more planes can be positioned on the same die. Exemplary planes K−1 (420), K (422), and K+1 (424) are depicted on FIG. 4. Each plane can include one or more blocks of memory. Exemplary plane K is shown to have a plurality of memory blocks, such as exemplary blocks L (430) and L+1 (432). Each block can include an array of memory cells that can be connected to a plurality of wordlines (WL) and a plurality of bitlines (BL). A circuitry that can be used to selectively couple WLs and BLs to voltage sources providing control gate and source-drain signals, respectively, is not explicitly depicted in FIG. 4.

Geometric information can include one or more geometric parameters that describe an order in which data is to be programmed into one or more memory components 212 of the memory sub-system 210. Geometric parameters can be provided to the host system 220 prior or during execution of one or more applications 226. In some implementations, the FNC 213 provides the geometric parameter to the host system 220. The geometric parameters can include indications of the capacity of a single memory cell. For example, the geometric parameters can include the number of bits N to be stored on a single memory cell: N=1 for a SLC, N=2 for a MLC, N=3 a TLC, N=4 for a QLC, and so on. The capacity of a memory cell can be variable, in some instances. For example, in some implementations, the memory controller 215 can program the memory component 212 differently depending on a time of programming, a type and a number of applications being executed on the host system 220, and so on. For example, when one (or merely a few) applications are running on the host system 220, the memory controller 215 can program the entire memory component 212 or any number of its partitions (dies, planes, blocks, wordlines) to have a lower value N (such as 1 or 2) to maximize reliability of the memory media, in one implementation. On the other hand, when the host system 220 needs to execute many applications, the memory controller 215 can reprogram the memory component 212 or some of its partitions to store more bits N (e.g., 3, 4, or more) on a single memory cell, in order to increase storage capacity. In some implementations, the number of bits N stored on a memory cell can vary from one partition to another. Correspondingly, the FNC 213 of the memory controller 215 can provide a plurality of values N for various partitions of one or more memory components 212. For example, the geometric parameters can provide that memory cells of plane 1 are to store N=2 bits of data whereas memory cells of plane 2 belonging to the first L blocks are to store N=4 bits of data, and the rest of the blocks of plane 2 are to store N=3 bits of data.

A memory cell capacity, provided as part of geometric parameters, can be as simple as a single value N, referring to all partitions of the memory component 212, in some implementations. In more advanced implementations, however, geometric parameters can contain a much more detailed information, including providing separate N values for a plurality or even—in some instances—for all partitions (dies, planes, blocks, and wordlines) of the memory component 212.

The values N provided to the host system 220 by the FNC 213 can be static, i.e. can be provided once for every loading of an application 226 or once every m times the application 226 is started. The same values N can be provided every time the application 226 is started. In some implementations, however, the values N can be provided to the host system dynamically. Namely, the controller 215 can update geometric parameters (including values N) periodically or every time the geometric parameters are changed. For example, the memory controller 215 can reprogram some of the partitions of the memory component 212 to increase (or decrease N) the number of bits stored on the memory cells thereof. Following such reprogramming of the memory partitions, the FNC 213 of the memory controller 215 can provide updated geometric parameters to the host system 220. In some implementations, the memory controller 215 can detect hardware deterioration (e.g., age-induced deterioration) of some partitions and determine that a specific partition can no longer provide reliable storage of data if the cells are used as a TLC or QLC and reprogram such cells for use as MLC or SLC (e.g., by marking those cells for such use). Accordingly, the FNC 213 of the memory controller 215 can provide this updated information to the host system 220, either right after the cells are marked for new uses, or at regular time intervals where updates are scheduled.

Geometric parameters provided by the FNC 213 to the host system 220 can further include a number of memory cells in a single wordline. This information, coupled with knowledge of the number N bits stored in each of the memory cells of a wordline, can indicate the size (e.g., 16 KB, 32 KB, or any other value) of a memory page that can be stored on a single wordline. Similarly, the geometric parameters can include a number of wordlines in a single block, a number of blocks in a single plane, a number of planes in a single die, a number of dies in the memory component(s) 212, and similar information about sizes of various partitions of the memory component(s) 212. In some implementations, such sizes can be determined globally for the entire (one or more) memory component(s) 212. In other implementations, the size of any of the aforementioned partitions can vary between different locations of the memory component 212. For example, some blocks can have 32 wordlines, while some can have 64 or 128 wordlines, or any other number of wordlines. In some implementations, the number of cells on a single wordline and the number of wordlines within a single block does not have to be separately included in the geometric parameters provided to the host system 220. Instead, the FNC 213 can provide the bit-capacity of a single block without specifying the internal topology of the block (i.e., its partitioning into wordlines and the size of the wordlines).

The memory controller 215 can supplement the topology of the memory component(s) 212 with a mapping information for that topology, and include the mapping information in the geometric information provided by the FNC 213 to the host system 220. Such mapping information can include descriptors intended to communicate to the host system 220 how logical addresses of the memory media used by the host system, e.g., LBAs, correspond to various physical partitions of the memory component(s) 212. More specifically, the mapping information can include an LBA increment (separation) corresponding to different partitions of the memory component(s) 212. For example, geometric parameters can include LBA increments for the same wordlines. More specifically, in one implementation, geometric parameters can include LBA increments between LP of a wordline (programmed on the first pass) and an UP and an XP (programmed on the second and third passes, respectively) of the same wordline. Similarly, geometric parameters can include LBA increments between, e.g., LPs (or UPs, XPs) of adjacent wordlines and/or non-adjacent wordlines. In case where LBA increments are provided for non-adjacent wordlines, geometric parameters can also include a corresponding physical separation between the wordlines (e.g., 7, 10, or 15 intervening wordlines).

The FNC 213 can provide similar information in reference to larger partitions (blocks, planes, dies, and the like). In some implementations, where LBA-to-physical address correspondence remains static over the lifetime of an application (e.g., the time between application restarts), the FNC 213 can also include base LBAs for various partitions. For example, a base LBA for a block, plane, or die can be a first LBA that is to be programmed onto the corresponding partition. For example, if LBA XYZ01 corresponds to a memory page that is to be stored starting with WL 0 of plane K, this information can be included into geometric parameters.

In some implementations, LBA increments and/or base LBAs can be dynamic and can change during the lifetime of the application. In such implementations, the FNC 213 can periodically provide updated mapping information to the host system 220, in the same way as described above for updates of the topology of the memory component(s) 212.

In addition to providing the topology and/or mapping information of the memory component 212, as described above, the FNC 213 can additionally provide programming information as part of the geometric parameters. For example, programming information can include programming sequence for programming various partitions of the memory component 212. More specifically, geometric parameters can include a sequence of programming of various wordlines within a single block as well as a sequence of programming various blocks, planes, and dies. For example, FIG. 4 illustrates one exemplary programming sequence when two blocks 430 and 432 are programmed concurrently (rather than consequentially). For example, a first programming pass can program the first wordline (WL 0, as depicted) of block 430. Moreover, only a low page (LP) can be stored on WL 0 initially. A second programming pass can similarly program an LP stored on WL 0 of block 432. A third programming pass can program a LP of WL 1 of the block 430, followed by a fourth programming pass to program a LP of WL 1 of the block 432, while a fifth (sixth) programming pass can program a LP of WL 2 of the block 430 (block 432). The seventh pass can return to WL 0 of the block 430 to program an upper page (UP) on WL 0 and the eighth pass can program an UP on WL 0 of the block 432. An XP on WL 0 can be programmed later, during S-th pass, which can occur after some UPs and yet more additional LPs have been programmed on both blocks 330 and 332. The exemplary sequencing shown in FIG. 4 is intended for illustration only. A person skilled in the art will recognize that the number of possible sequencing schemes for programming operations is virtually unlimited. Selection of one or more sequencing schemes that the memory controller 215 can use to program one or more components 212 can be accomplished with an objective of minimizing electrostatic interference between neighboring memory cells (wordlines, blocks, etc.), maximizing the write or read speed, and so on. Accordingly, any number of dies, planes, blocks, wordlines, or any other partitions can be programmed concurrently, as illustrated in FIG. 4.

Accordingly, the geometric parameters can include one or more sequencing schemes that can be used by the controller 115 to program one or more memory components 212. The controller 115 can use different sequencing schemes depending on the type of applications running on the host system 220. The geometric parameters can further include indications regarding sequencing schemes can be used under specific conditions, e.g. to store data for various applications 226. The programming information (including the sequencing schemes) does not have to remain static and can be modified by the memory controller 215. If the programming scheme is modified, the FNC 213 may update the host system 220 with the new programming information.

Figure 5:
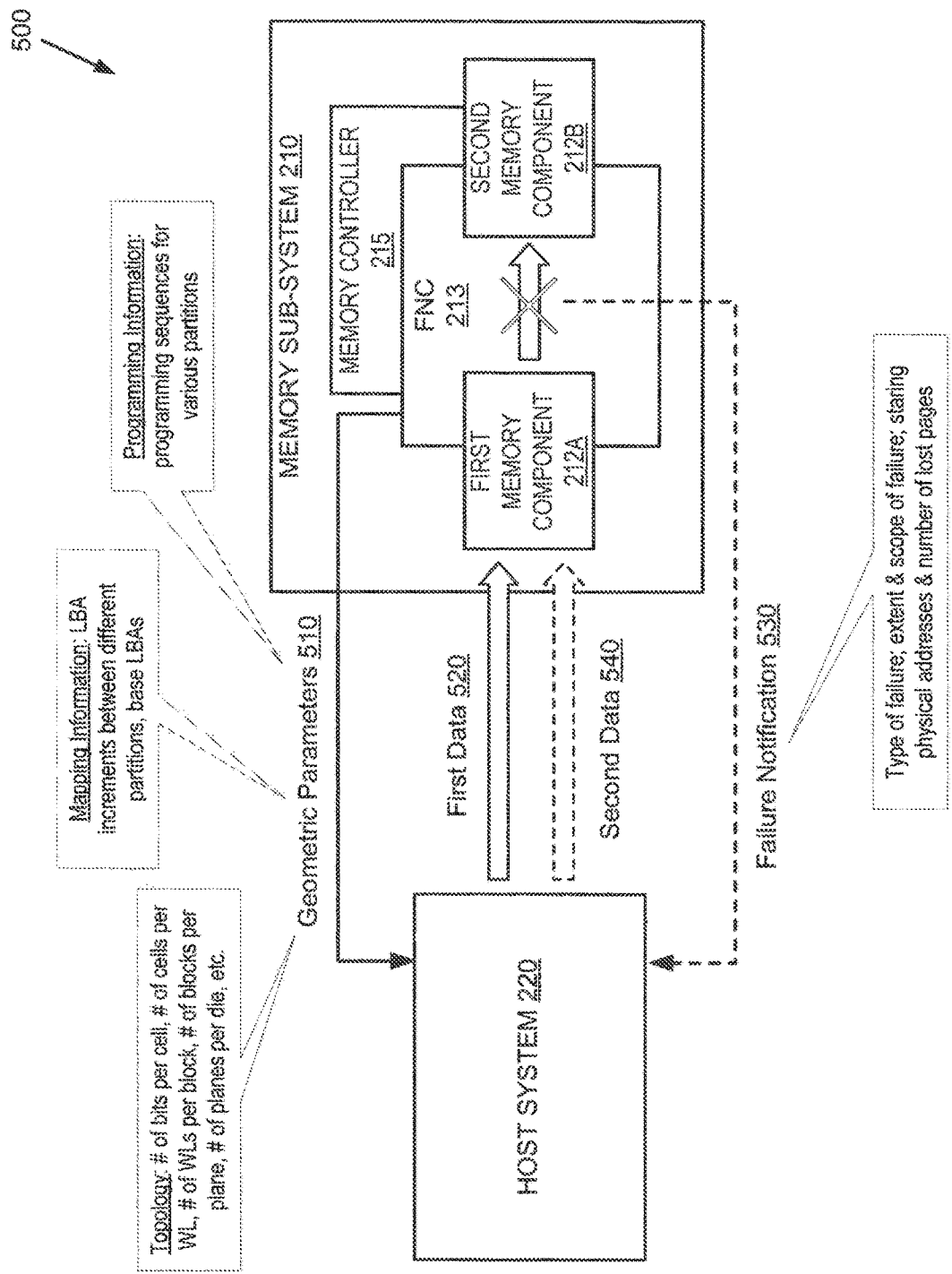
FIG. 5 illustrates exemplary communication flows depicting exchange of data between a host system and a memory subsystem, such as providing geometric parameters and detailed failure notifications to the host system to receive additional data to remedy an unsuccessful write operation, in accordance with some implementations of the disclosure.

FIG. 5 illustrates exemplary communication flows 500 depicting exchange of data between a host system 220 and a memory subsystem 210, such as providing geometric parameters and detailed failure notifications to the host system 220 to receive additional data to remedy an unsuccessful write operation, in accordance with some implementations of the disclosure. In one implementation, the host system 220 can be running one or more applications 226. The memory controller 215 can provide geometric parameters 510, as described above. The geometric parameters 510 can be provided when the host system 220 boots or initializes, when one or more of the applications 226 are starting, at regular time intervals, when the memory controller 215 changes the way one or more memory components 212 are programmed, and so on. The host system 220 can store a first data 520 in the memory sub-system 210. The first data 520 can be related to execution of one or more applications 226 on the host server 220. The first data 520 can first be stored in a first memory component 212A, which can be a volatile SRAM or DRAM memory (such as cache) of the memory sub-system 210. The first memory component 212A can be capable of fast write and read data operations. The first data 520 can remain within the first memory component 212A during an active stage of the application execution. For example, if the application 226 is a self-driving automotive application, the first data 520 can remain in the first memory component 215 while the self-driving vehicle is actively negotiating traffic congestions, steering through a series of turns, starting and/or stopping, accelerating, and so on.

During downtime (e.g., in cruise mode), the memory controller 215 can migrate the first data 520 to the second memory component 212B, as shown by the open arrow between the two memory components. The second memory component 212B can be a flash memory, such as NAND, NOR, cross-point array, or similar media. During migration of the first data 520, a hardware failure of the second memory component 212B can occur. The hardware failure can result in the incorrect storing of the first data 520. Additionally, data previously stored in the memory component 212B (e.g., in the adjacent wordlines, blocks, planes, etc.) can be lost or corrupted. If the first data 520 is still available on the first memory component 212 and no previously stored data has been affected, the memory controller 215 can be capable of repeating the write operation to remedy the failure of the prior write operation. However, the first data 520 may have already been overwritten on the first memory component 212A. For example, the host system 220 may have flushed the cache 212A. In such instances, the memory sub-system 210 can be incapable of restoring the lost data. Similarly, the memory sub-system can be unable to restore data previously stored in the second memory component 212B that has been lost or corrupted during migration of the first data. If an error of one of these types occurs, the memory controller can provide failure notification 530 to the host system 220 so that the host system 220 can take a remedial action to avoid critical system failures in the future. The memory controller 215 can be capable to determine that a write failure occurs when one or more programming operation terminates at a failing branch within the microcode of the controller 215. For example, the memory controller 215 can determine a termination path that the failed programming operation has taken within a firmware of the memory controller 215. In some implementations, the memory controller 215 can generate a response that can include a "sense key" specifying details of the failed programming operation, such as RECOVERY ERROR, MEDIA ERROR, HARDWARE ERROR, ILLEGAL REQUEST, and so on.

The failure notification 530 can be a command response, which can include a basic command result—pass or fail, as well as other response information. Such additional response information can include a type of a write operation programming error that has occurred. For example, a programming error type can be "data-in-flight error only" indicating that no previously stored data has been affected. This programming error type can be accompanied by information about what LBAs of the second memory component 212B are storing the first data (data-in-flight) that has not been written correctly. Another type of a write operation programming error can be "data-in-flight+data-at-rest error" indicating that some previously stored data has been lost or corrupted. In addition to identifying the type of error, the FNC 213 can provide notification regarding the scope and extent of the failure, in some implementations. In some implementations, the Sense Key information, when provided together with geometric descriptors of a failure, can allow the host system 220 to determine what regions of the memory components 212 to explore for possible additional data corruption that could have occurred during a programming operation failure. For example, if during programming of an UP of a specific wordline upon a second pass (or programming of an XP during a third pass) the data previously stored on the LP (or both the data stored on the UP and the XP) of the same wordline was corrupted, the FNC 213 can include this information into the failure notification together with the "data-in-flight+data-at-rest error" identifier. In some implementations, the FNC 213 may not specify which of the pages previously stored on the same wordline have been corrupted and, instead, communicate an "entire wordline" error.

In some implementations, a programming effort may affect more than a single wordline. For example, the processor 217 of the memory sub-system 210 can determine that a hardware failure has occurred and that data stored on than one wordline has been lost/corrupted. The hardware failure can be a result of an electrostatic interference between different memory cells. The hardware failure can alternatively occur because of electric failure, such as incorrectly selected wordlines or bitlines or a short circuit of a correctly selected wordline or bitline with other wordlines or bitlines. In some instances, a hardware failure can affect a larger partition, e.g., a part of (or an entire) block, a plane, or a die. The FNC 213 can include an identification of the extent of the program (e.g., hardware) failure into the failure notification.

In some implementations, the first data 520 may not be stored in the first memory component 212A and can go directly to the second memory component 212B following a command from the host system 220. In such implementations, the failure notification can be a command response informing the host system 220 that its last command failed and, possibly, corrupted other data as well.

Various formats of failure notifications and/or command responses can be implemented. In one implementation, the failure notification can include a general response code, such as pass, fail, invalid operation, timeout, and the like. The general response code can occupy a 2-4 bit field, although the size of this field can be different. The failure notification can also include a detailed response code, which can have a 2-4 byte size but can be larger or smaller, depending on how much information is provided to the host system 220. The detailed response code can inform the host system 220 of the type of pass or fail that has occurred. For example, the detailed notification code can inform the host system 220 that the write operation has been successfully performed, that the data-in-flight has been stored in the memory or that the data-in-flight has been stored in cache but has not been stored in the flash memory. In those instances where the general response code indicates a fail, the detailed notification code can inform the host system 220 that the data-in-flight has been lost, that an entire wordline (or another partition) of the memory has been corrupted, and can additionally identify the corrupted partitions. In some implementations, the detailed notification code can inform the host system 220 that the data-in-flight has been successfully stored, but that a previously stored data has been lost or corrupted in the process.

The failure notification can contain additional fields to provide more information to the host system 220. For example, a failure notification can include a 2-4 byte field to identify a starting physical address (e.g., a physical address of a wordline or a block) that has been used in the last write operation. The failure notification can further identify (e.g., using an additional 1-2 byte size field) how many units of data (e.g., 4 KB units of memory) have been lost during the last write operation.

When the host system 220 receives the failure notification 530 from the FNC 213 of the memory controller 215, the host system 220 can respond with a remedial action to restore the lost or corrupted data. The host system 220 can first determine what data has been lost. To do this, the host system 220 can access the geometric parameters 510 and determine the range of failed LBAs. For example, with reference to FIG. 4, the failure notification can indicate that during pass 8, the programming of the UP on WL 0 of block 432 has failed and also corrupted data previously stored on LP of WL 1. The failure notification can (optionally) indicate that WL 0 is the first wordline of block 432. From the programming information and the mapping information included in the geometric parameters 510, the host system 220 can determine that LP of WL 0 was programmed six passes ago (i.e. during pass 2). The host system 220 can then determine, using the LBA increment for programming various pages of the same wordline and the LBA of the page that was programmed during pass 8, a specific LBA (or a range of LBAs) that corresponds to the data stored in the LP of WL 0. Similarly, the host system 220 can determine what LBAs correspond to the data that was stored on the adjacent WL 1 during pass 4 (and on WL 2 during pass 6, if applicable). In some implementations, the failure notification can include information that an entire block (plane, die) or a plurality of blocks (planes, dies) have been corrupted. The host system 220 can then retrieve the topology information from the geometric parameters 510 to identify the amount of physical media that presently contains incorrect information. Using the mapping information, the host system 220 can then be able to determine the LBAs that are associated with the failed physical partitions.

Equipped with the knowledge of the range of failed LBAs, the host system 220 can determine what remedial action can be taken to restore or replace lost or corrupted data. If the host still has access to the data (e.g., on host's own cache), the host 220 can repeat the write operation by transferring to the memory subsystem 210 a second data 540 that can be a copy of the first data 520. In some implementations, the memory controller can write the replacement second data 540 into the physical partitions that correspond to the same range of LBAs as previously failed. In other implementations, the second data can be stored into new LBAs. In some implementations, the lost/corrupt data can be a part of a large file. In such instances, the host 220 will not resend the entire file, but can resend only those packets that have actually been lost/corrupted. In some implementations, a copy of the first data 520 can no longer be available on the host system 220. If the same data is accessible elsewhere, e.g., via a network download, the host system 220 can be able to fetch the copy of the first data 520 and provide it, as the second data 540, to the memory sub-system 210.

In some implementations, no copy of the first data 520 can be available on (or accessible to) the host system 220. In such implementations, the host system 220 can be capable of transitioning to a state that the host system 220 had prior to the first data write operation. For example, the host system 220 can determine that the data lost/corrupted is associated with a particular application (or a plurality of applications). The host system can then be capable of determining where a context associated with the application is stored. The context can be the most recent context of the application prior to the failed write operation. The host system 220 can resume the application starting from this most recent context and repeat a sequence of operations starting from this context. By repeating these operations, the host system 220 can eventually arrive at the second data 540 and store this second data onto the memory sub-system 210. The second data 540 can turn out to be a copy of the first data 520, in some implementations. For example, if the host system 220 is attempting to store a compressed video as the first data 520 and the host system 220 determines that the lost/corrupt data belongs to the same video, the host system 220 can determine the last frame that was properly stored. The host system 220 can then transition to a context where it resumes storage starting from this last frame. In some implementations, the second data 540 can be different from the first data 520 even if the host system 220 repeats same sequence of operations. This can happen because of the passage of time and/or the changing computational conditions or the environment. For example, data generated by an automotive (e.g., self-driving) application can be constantly changing, reflecting changing driving conditions.

Figure 6:
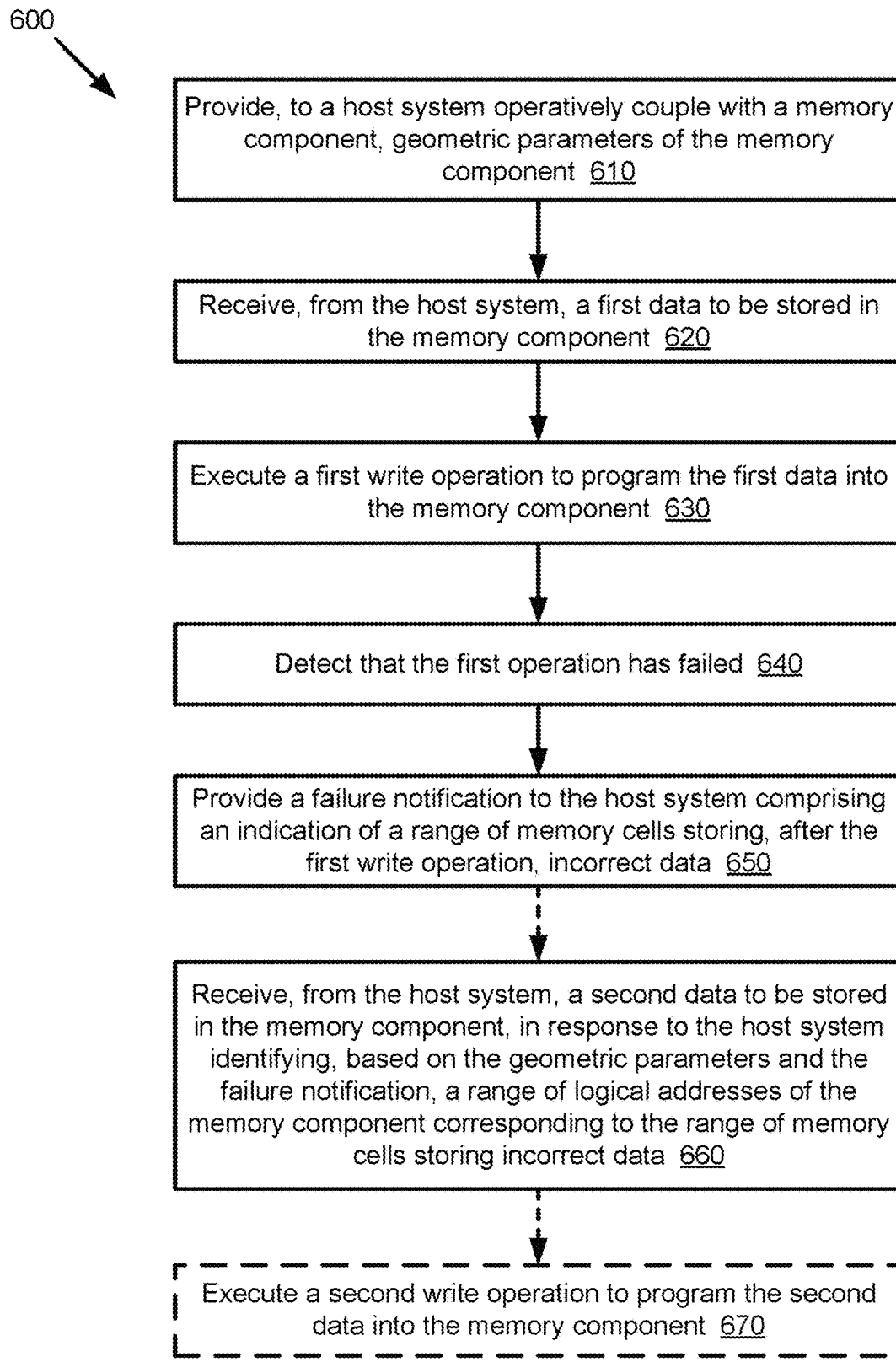
FIG. 6 is a flow diagram of an example method for implementing failure notifications between a memory sub-system and a host system and remedying unsuccessful write operations, in accordance with some implementations of the disclosure
Figure 7:
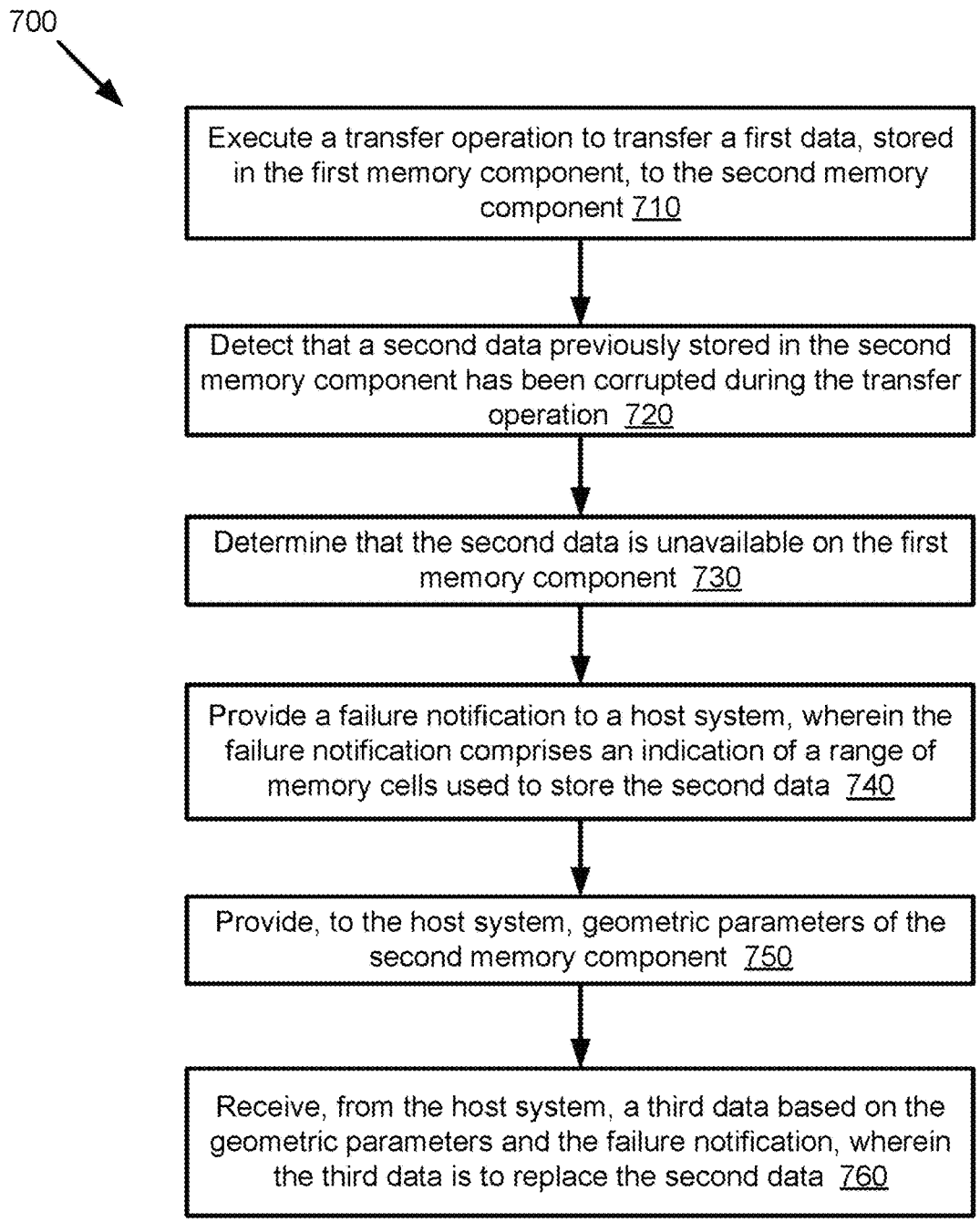
FIG. 7 is a flow diagram of another example method for implementing failure notifications between a memory sub-system and a host system and remedying unsuccessful write operations, in accordance with some implementations of the disclosure.

FIG. 6 and FIG. 7 illustrate method 600 and method 700, respectively. The method 600 or method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, method 600 or method 700 is performed by the failure notification component 113 of FIG. 1 or failure notification component 213 of FIG. 2. Although shown in a particular order, unless otherwise specified, the order of the operations can be modified. Thus, the illustrated implementations should be understood only as examples, and the illustrated operations can be performed in a different order, with some operations can be performed in parallel. Additionally, one or more operations can be omitted in various implementations. Thus, not all operations are required in every implementation. Other operations flows are possible. In some implementations, different operations can be used. It can be noted that aspects of the present disclosure can be used for any type of multi-bit memory cells.

FIG. 6 is a flow diagram of an example method for implementing failure notifications between a memory sub-system and a host system and remedying unsuccessful write operation, in accordance with some implementations of the disclosure. For purposes of illustration, rather than limitation, method 600 describes providing failure notifications in conjunction with geometric information about the memory sub-system 210. Aspects of the disclosure can be applied to locating lost or corrupted data and taking a remedial action. For instance, aspects of the disclosure can be used to generate replacement data and prevent the host system from experiencing critical system failures caused by the loss of data or by incorrect data.

At operation 610, a processing logic performing method 600 can provide, to a host system (e.g., the host system 220) operatively coupled with a memory component (e.g., one of the memory components 212), geometric parameters of the memory component. The geometric parameters can include information about the topology of the memory component, mapping information for the memory component, and programming information for the memory component. The topology information can include a physical layout of the memory component, including at least some or all of the number of bits that can be stored in a memory cell, the number of cells in a wordline, the number of wordline in a block and so on, from the lowest to the highest partitions of the memory component. The mapping information can include logical address separations (such as LBA increments) between different partitions of the memory component and well as base logical addresses (e.g., the LBAs corresponding to the first pages/blocks of a specific partition). The programming information can include programming sequences for various partitions as well as indications whether different partitions are to be programmed concurrently or sequentially, and in what order, relative to other partitions. Not all geometric parameters have to be provided to the host system in all implementations.

At operation 620, the processing logic can receive (e.g., by the memory sub-system 210) from the host system a first data to be stored in the memory component. In some implementations, the first data can be stored directly in the memory component (e.g., flash memory). In other implementations, the first data can initially be stored somewhere else (e.g, in cache of the memory sub-system, in a SRAM or DRAM volatile memory, and the like) and is to be migrated to the memory component at some later time. At operation 630, the processing logic can execute a first write operation to program the first data into the memory component. For example, a processor of the memory sub-system can program a plurality of memory cells to store an appropriate amount of charge thereon indicative of one or more bit values of data that is to be stored in the memory cell. The first write operation can store one page of data (e.g., a LP on a selected WL), or can alternatively store less than one page of data (a fraction of a WL), or more than one page of data. For example, the first write operation can program data into a plurality of wordlines, a plurality of blocks, planes, dies, etc. Multiple partitions of the memory component can be programmed concurrently or consequently.

At operation 640, the processing logic can detect that the first operation has failed. The failure of the first operation can have an arbitrary scope and extent. In some implementations, the failure can be relatively localized and affect data stored (or intended to be stored) in only a few (or even just one) cells. In other implementation, the failure can affect an entire partition—page (e.g., wordline), block, plane, etc.—or a plurality of partitions. The failure of the first write operation can be a failure to store the first data (the data-in-flight) on specific memory cells or can involve modifying (corrupting) data previously stored on the same memory cells or other (e.g., adjacent or physically proximate) memory cells and/or partitions.

The processing device can determine the physical partitions that have failed during the first write operation and that are presently storing incorrect data. At operation 650, the processing logic can generate a failure notification and provide it to the host system. The failure notification can include an indication of a range of memory cells storing, after the first write operation, incorrect data. The failure notification can include a basic information regarding the type of failure and can further provide an additional detailed information regarding the failure, as disclosed above. For example, the failure notification can specify memory cells that have failed during the first write operation. This can be performed by specifying one or more partitions where the failed cells are located by, e.g., identifying a physical address of the first failed partition (wordline, page, or block) and a number of lost pages of data.

At operation 660, the processing logic can receive a second data to be stored in the memory component. The second data can be generated by the host system in response to the host system identifying, based on the geometric parameters and the failure notification, a range of logical addresses of the memory component corresponding to the range of memory cells storing incorrect data. For example, as described above, the host system can generate (and provide to the memory sub-system) the second data that is a copy of the first data if the first data is still available on the host system (or accessible via a network connection). If the copy of the first data is not available to the host system, the host system can transition to a state that it had at some point prior to the first write operation. For example, the host system can identify one or more applications whose data has been lost or corrupted and resume execution of these applications from the most recent context that was saved prior to the first write operation. After repeating operations related to the resumed applications, the host system can generate replacement second data (which can be identical to the first data or different from the first data), depending on the nature of the application) and provide to the memory component.

At operation 670, the processing logic can optionally execute a second write operation to program the received second data into the memory component. The second write operation can be performed in a way similar to the first write operation. In some implementations, the second write operation can program data into the same physical partitions as in the case of the first write operation. In some implementations, the second write operation can use different physical partitions. In some implementations, the second write operation can fail in a way similar to how the first write operation failed. In such instances, the memory sub-system can provide an additional failure notification and the host system can determine the remedial response in a way similar to the above-described response for the first failed write operation.

FIG. 7 is a flow diagram of another example method 700 for implementing failure notifications between a memory sub-system and a host system (e.g., host system 220) and remedying unsuccessful write operations, in accordance with some implementations of the disclosure. Method 700 can be performed by a processing device (e.g., a memory controller 215 of the memory subsystem 210) operatively coupled with a first memory component (e.g. a cache component 212A) and a second memory component (e.g., a NAND component 212B). The first memory component can store a first data received previously from the host system. At operation 710, the processing device performing method 700 can execute a first operation to transfer the first data from the first memory component to the second memory component.

At operation 720, the FNC 213 (or FNC 113), which can be monitor programming (write, transfer) operations performed by the controller 215, can detect that a second data previously stored in the second memory component has been corrupted during the transfer operation. For example, the second data could have been stored in physical partitions that are proximate to the partitions that accepted the transfer of the first data, so that the gate operations performed to store the first data caused an interference (e.g., due to electrostatic interactions or magnetic interactions) with the physical partitions storing the second data.

At operation 730, the FNC 213 can verify whether a copy of the second data is unavailable in the first memory component. For example, the second data were stored in the first memory component at some point in the past, and since then, have been overwritten with new data. Having determined that the second data is not available, the FNC, at operation 740, can provide a failure notification to the host system, the failure notification including an indication of a range of memory cells used to store the second data in the second memory component. The failure notification can be similar to the failure notification of the operation 650 of method 600 and can describe the scope and extent of the write/transfer operation failure.

At operation 750, the FNC 213 can provide to the host system geometric parameters describing physical topology of the memory component. The geometric parameters can describe how logical addresses used by the host system 120 for memory accesses are mapped on the physical addresses of second memory component. Operation 750 can be performed at a different order compared with the order shown in FIG. 7. For example, operation 750 can be performed at the beginning of method 700. FNC 213 can perform operation 750 in a way that is similar to operation 610 of method 600.

At operation 760, the FNC 213 can receive, from the host system, a third data based on the geometric parameters and the failure notification. Having received the failure notification, the host system can retrieve the geometric parameters and determine a programming sequence of various partitions (dies, planes, blocks, wordlines) of the second memory component. Specifically, by comparing the information included in the failure notification with the geometric parameters of the memory component, the host system can determine the range of logical addresses associated with (in the following often simply referred as "storing") the second data. For example, the host system can trace back its memory operations and determine what data was stored in the logical addresses associated with the physical addresses of the second memory component that stored the second data. The host system can one or more remedial actions. For example, a copy of the second data can still be available inside the host system or in a separate memory device (e.g., cache) accessible to the host system. If a copy of the second data is no longer available on the host system, the host system can repeat selected computational operations in order to restore the lost data. For example, the host system can return to a saved context (e.g. the most recent saved context) of the application that the host system is running and resume execution of the application starting from that saved context. As a result, the host system can generation a third data, which can be a replacement data to replace the lost second data. The third data can be an exact copy of the second data, in some implementations. In other implementations, the third data can be different from the second data, e.g., the third data can reflect the changes in the context of the application run by the host system that occurred since the time when the host system generated the second data. The host system can transfer the third data to the memory sub-system. Having received the third data, the memory subsystem can store the third data in the first or second memory components (or in some of other memory components 212A-N of the memory sub-system).

In some implementations, the third data can be stored in (e.g., programmed into) the second memory component. In other implementations, the third data may first be stored in the first memory component and subsequently transferred into the second memory component. The processing device performing method 700 may then confirm that the third data is correctly stored in the second memory component. After confirming that the third data has transferred correctly, the processing device (e.g., the memory controller) can make a region of the first memory component used to store the third data as free (e.g., by marking the region as free—available to accept data during subsequent write operations). If it is determined that the third data has not transferred correctly, the processing device can repeat the transfer of the third data from the first memory component to the second memory component.

Figure 8:
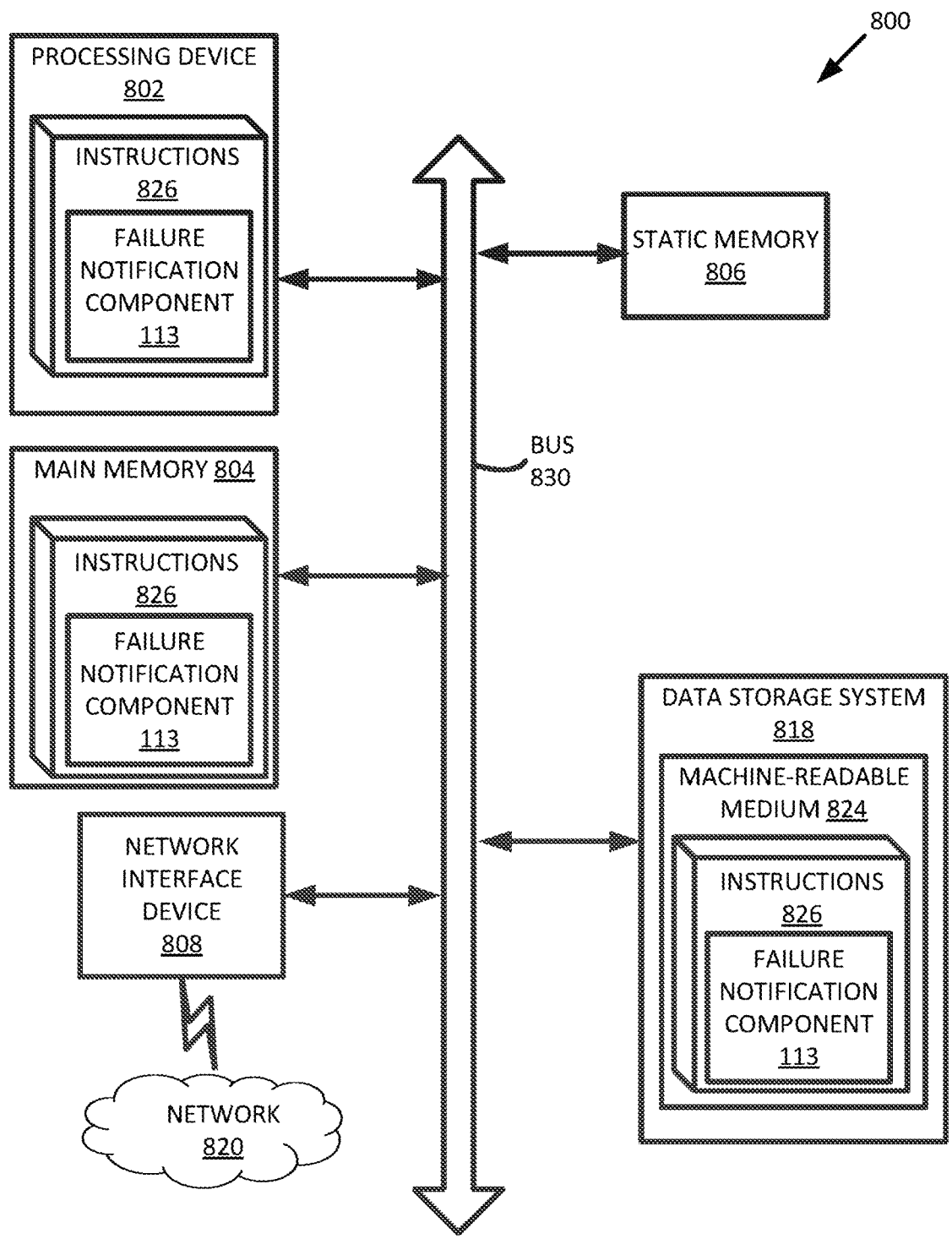
FIG. 8 illustrates an example machine of a computer system within which a set of instructions, for causing the machine to perform any one or more of the operations discussed herein, can be executed.

FIG. 8 illustrates an example machine of a computer system 800 within which a set of instructions, for causing the machine to perform any one or more of the methodologies discussed herein, can be executed. In some implementations, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the failure notification component 113 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 608 to communicate over the network 820.

The data storage system 818 can include a machine-readable storage medium 824 (also known as a non-transitory computer-readable storage medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one implementation, the instructions 826 include instructions to implement functionality corresponding to the failure notification component 113 of FIG. 1. While the machine-readable storage medium 824 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an implementation" or "one implementation" or the like throughout is not intended to mean the same implementation or implementation unless described as such. One or more implementations or implementations described herein may be combined in a particular implementation or implementation. The terms "first," "second," "third," "fourth," etc. as used herein are meant as labels to distinguish among different elements and may not necessarily have an ordinal meaning according to their numerical designation.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A system comprising:
a memory device; and a processing device, operatively coupled with the memory device, to perform operations comprising:
providing a failure notification to a host system, wherein the failure notification comprises an indication of one or more memory cells of the memory device storing first data corrupted during a memory operation; and
receiving, from the host system, a second data to be stored in the memory device, in response to the host system identifying, based on geometric parameters of the memory device and the failure notification, a range of logical addresses corresponding to the indication of the one or more memory cells storing the corrupted first data.

2. The system of claim 1, wherein the corrupted first data comprises at least one of (i) a data attempted to be stored during the memory operation or (ii) a data stored prior to the memory operation.

3. The system of claim 1, wherein the indication of the one or more memory cells storing the corrupted first data comprises a physical address of the one or more memory cells storing the corrupted first data.

4. The system of claim 1, wherein the indication of the one or more memory cells storing the corrupted first data comprises a number of memory cells storing the corrupted first data.

5. The system of claim 1, wherein the second data comprises replacement data for the corrupted first data.

6. The system of claim 5, wherein the operations further comprise:
executing a write operation to program the second data to the memory device.

7. The system of claim 1, wherein the geometric parameters of the memory device comprise at least one of:
a number of memory cells that are to be programmed during a single write operation;
a number of memory cells to be used to program a logical memory page;
a logical address increment between a first physical partition of the memory device and a second physical partition of the memory device, wherein each of the first physical partition and the second physical partition comprise multiple memory cells;
information about a number of bits to be stored on a memory cell of the memory device; or
an order in which a plurality of memory cells of the memory device are to be programmed during a write operation.

8. A method comprising:
providing, from a memory device, a failure notification to a host system, wherein the failure notification comprises an indication of one or more memory cells of the memory device storing first data corrupted during a memory operation; and
receiving, from the host system, a second data to be stored in the memory device, in response to the host system identifying, based on geometric parameters of the memory device and the failure notification, a range of logical addresses corresponding to the indication of the one or more memory cells storing the corrupted first data.

9. The method of claim 8, wherein the corrupted first data comprises at least one of (i) a data attempted to be stored during the memory operation or (ii) a data stored prior to the memory operation.

10. The method of claim 8, wherein the indication of the one or more memory cells storing the corrupted first data comprises a physical address of the one or more memory cells storing the corrupted first data.

11. The method of claim 8, wherein the indication of the one or more memory cells storing the corrupted first data comprises a number of memory cells storing the corrupted first data.

12. The method of claim 8, wherein the second data comprises replacement data for the corrupted first data.

13. The method of claim 12, further comprising:
executing a write operation to program the second data to the memory device.

14. The method of claim 8, wherein the geometric parameters of the memory device comprise at least one of:
a number of memory cells that are to be programmed during a single write operation;
a number of memory cells to be used to program a logical memory page;
a logical address increment between a first physical partition of the memory device and a second physical partition of the memory device, wherein each of the first physical partition and the second physical partition comprise multiple memory cells;
information about a number of bits to be stored on a memory cell of the memory device; or
an order in which a plurality of memory cells of the memory device are to be programmed during a write operation.

15. A non-transitory computer-readable medium storing instructions that, when executed by a processing device, cause the processing device to perform operations comprising:
providing, from a memory device, a failure notification to a host system, wherein the failure notification comprises an indication of one or more memory cells of the memory device storing first data corrupted during a memory operation; and
receiving, from the host system, a second data to be stored in the memory device, in response to the host system identifying, based on geometric parameters of the memory device and the failure notification, a range of logical addresses corresponding to the indication of the one or more memory cells storing the corrupted first data.

16. The non-transitory computer-readable medium of claim 15, wherein the corrupted first data comprises at least one of (i) a data attempted to be stored during the memory operation or (ii) a data stored prior to the memory operation.

17. The non-transitory computer-readable medium of claim 15, wherein the indication of the one or more memory cells storing the corrupted first data comprises at least some of:
a physical address of the one or more memory cells storing the corrupted first data; or
a number of memory cells storing the corrupted first data.

18. The non-transitory computer-readable medium of claim 15, wherein the second data comprises replacement data for the corrupted first data.

19. The non-transitory computer-readable medium of claim 18, wherein the operations further comprise:
executing a write operation to program the second data to the memory device.

20. The non-transitory computer-readable medium of claim 15, wherein the geometric parameters of the memory device comprise at least one of:
a number of memory cells that are to be programmed during a single write operation;

a number of memory cells to be used to program a logical memory page;

a logical address increment between a first physical partition of the memory device and a second physical partition of the memory device, wherein each of the first physical partition and the second physical partition comprise multiple memory cells;

information about a number of bits to be stored on a memory cell of the memory device; or an order in which a plurality of memory cells of the memory device are to be programmed during a write operation.

* * * * *